(12) United States Patent
Lin

(10) Patent No.: US 10,229,877 B2
(45) Date of Patent: Mar. 12, 2019

(54) SEMICONDUCTOR CHIP AND MULTI-CHIP PACKAGE USING THEREOF

(71) Applicant: NANYA TECHNOLOGY CORPORATION, Taoyuan (TW)

(72) Inventor: Po Chun Lin, Changhua (TW)

(73) Assignee: Nanya Technology Corporation, Taoyuan (TW)

( * ) Notice: Subject to any disclaimer, the term of this patent is extended or adjusted under 35 U.S.C. 154(b) by 11 days.

(21) Appl. No.: 15/189,437

(22) Filed: Jun. 22, 2016

(65) Prior Publication Data

US 2017/0373003 A1 Dec. 28, 2017

(51) Int. Cl.
| | | |
|---|---|---|
| *H01L 23/48* | (2006.01) | |
| *H01L 23/52* | (2006.01) | |
| *H01L 23/522* | (2006.01) | |
| *H01L 21/768* | (2006.01) | |
| *H01L 23/528* | (2006.01) | |
| *H01L 23/544* | (2006.01) | |
| *H01L 25/11* | (2006.01) | |

(Continued)

(52) U.S. Cl.
CPC .... *H01L 23/5226* (2013.01); *H01L 21/76877* (2013.01); *H01L 23/481* (2013.01); *H01L 23/5283* (2013.01); *H01L 23/544* (2013.01); *H01L 25/0657* (2013.01); *H01L 25/117* (2013.01); *H01L 25/50* (2013.01); *H01L 2223/5442* (2013.01); *H01L 2223/54426* (2013.01); *H01L 2223/54473* (2013.01); *H01L 2224/16145* (2013.01); *H01L 2225/06513* (2013.01); *H01L 2225/06541* (2013.01); *H01L 2225/06544* (2013.01); *H01L 2225/06593* (2013.01)

(58) Field of Classification Search
CPC ........... H01L 21/76877; H01L 23/5283; H01L 23/544; H01L 25/117; H01L 25/50; H01L 23/5226; H01L 2225/06544; H01L 2223/54426; H01L 23/481; H01L 25/0657
USPC .......................... 257/744, 686, 723, 777, 774
See application file for complete search history.

(56) References Cited

U.S. PATENT DOCUMENTS

| | | | | |
|---|---|---|---|---|
| 6,590,258 | B2 * | 7/2003 | Divakauni | ........ H01L 21/76838 257/296 |
| 7,031,578 | B2 * | 4/2006 | Marion | ................ G02B 6/4204 216/24 |
| 7,122,912 | B2 | 10/2006 | Matsui | |

(Continued)

FOREIGN PATENT DOCUMENTS

| | | |
|---|---|---|
| TW | 200952108 A | 12/2000 |
| TW | 200931490 A | 7/2009 |

*Primary Examiner* — Kimberly N Rizkallah
*Assistant Examiner* — Dilinh Nguyen
(74) *Attorney, Agent, or Firm* — Muncy, Geissler, Olds & Lowe, P.C.

(57) ABSTRACT

The present disclosure provides a semiconductor chip having a non-through plug contour (buried alignment mark) for stacking alignment and a multi-chip semiconductor device employing thereof, and to a method for manufacturing same. In some embodiments, the semiconductor chip includes a semiconductor substrate having a first side and a second side, a conductive through plug extending through the semiconductor substrate from the first side to the second side, and a non-through plug extending from the first side to an internal plane of the semiconductor substrate without extending through the second side.

11 Claims, 14 Drawing Sheets

(51) Int. Cl.
    *H01L 25/00*     (2006.01)
    *H01L 25/065*     (2006.01)

(56) References Cited

U.S. PATENT DOCUMENTS

| | | |
|---|---|---|
| 8,546,961 B2 | 10/2013 | Farooq et al. |
| 2007/0216041 A1* | 9/2007 | Patti ................ H01L 21/76898 257/797 |
| 2010/0224876 A1 | 9/2010 | Zhu |
| 2010/0258918 A1 | 10/2010 | Matsui et al. |
| 2012/0056315 A1 | 3/2012 | Chang et al. |
| 2012/0056330 A1* | 3/2012 | Lee ................ H01L 21/76898 257/774 |
| 2016/0099210 A1* | 4/2016 | Kwon ............. H01L 21/76829 257/774 |

* cited by examiner

SEMICONDUCTOR CHIP AND MULTI-CHIP PACKAGE USING THEREOF

TECHNICAL FIELD

The present disclosure relates to a semiconductor chip having a non-through plug contour for stacking alignment and a multi-chip semiconductor device employing thereof, and to a method for manufacturing same.

DISCUSSION OF THE BACKGROUND

Chip stacking technology can bring two chips close together, thereby enabling faster data transmission between the two chips and consuming less power. Memory chips can be stacked together to obtain a memory module with a large storage capacity. In addition to stacking two of the same chip, two chips with different functions may also be stacked together to combine different functions.

For example, three-dimensional integration of semiconductor chips typically employs through-substrate vias (TSV's) that connect the first side of a semiconductor chip to a second side of the same semiconductor chip. Multiple semiconductor chips may be vertically stacked employing the through-substrate vias (TSV's). While such benefits of three-dimensional integration of semiconductor chips are generally known, vertical stacking of multiple semiconductor chips requires die-to-die, die-to-wafer, or wafer-to-wafer alignment. In other words, the alignment between the two bonded objects is the key technique to implement the three-dimensional integration semiconductor chips typically employing through-substrate vias.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

The present disclosure provides a semiconductor chip having a non-through plug (buried alignment mark) contour for stacking alignment and a multi-chip semiconductor device employing thereof, and to a method for manufacturing same.

One aspect of the present disclosure provides a semiconductor chip having a buried alignment mark. In some embodiments, the semiconductor chip includes a semiconductor substrate having a first side and a second side, a conductive through plug extending through the semiconductor substrate from the first side to the second side, and a non-through plug extending from the first side to an internal plane of the semiconductor substrate without extending through the second side.

In some embodiments, the non-through plug comprises an alignment mark, and the alignment mark is visually recognizable in a plane view from the second side.

In some embodiments, the non-through plug comprises a visually recognizable two-dimensional pattern in a plane view from the second side.

In some embodiments, the semiconductor chip further comprises a plurality of non-through plugs extending through the semiconductor substrate from the first side to the second side.

In some embodiments, the plurality of non-through plugs forms an alignment mark, and the alignment mark is visually recognizable in a plane view from the second side.

In some embodiments, the plurality of non-through plugs form a visually recognizable two-dimensional pattern in a plane view from the second side.

In some embodiments, the plurality of non-through plugs have the same width.

In some embodiments, the non-through plug and the conductive through plug are configured to be visually distinctive in a plane view from the second side.

In some embodiments, the conductive through plug has a first width, and the non-through plug has a second width smaller than the first width.

In some embodiments, the semiconductor chip further comprises a first conductive member on the first side; a second conductive member on the second side; and the conductive through plug electrically couple the first conductive member with the second conductive member, while the non-through plug does not electrically couple the first conductive member with the second conductive member.

In some embodiments the non-through plug and the conductive through plug are composed of the same conductive material.

Another aspect of the present disclosure provides a chip package including a first semiconductor chip and a second semiconductor chip. In some embodiments, the first semiconductor dip includes a semiconductor substrate having a first side and a second side, a conductive through plug extending through the semiconductor substrate from the first side to the second side, and a non-through plug extending from the first side to an internal plane of the semiconductor substrate without extending through the second side. In some embodiments, the second semiconductor chip is adjacent to the first semiconductor chip, the conductive through plug is coupled to a conductive member of the second semiconductor chip, and the non-through plug is aligned with an alignment pattern on the second semiconductor chip.

Another aspect of the present disclosure provides a method for manufacturing a semiconductor chip with a buried alignment mark. In some embodiments, the method includes the steps of preparing a semiconductor substrate having a first side and a second side; forming a first hole and a second hole in the semiconductor substrate, wherein the first hole has a first depth and the second hole has a second depth smaller than the first depth; and forming a conductive through plug in the first hole and a non-through plug in the second hole, wherein the conductive through plug extends through the semiconductor substrate from the first side to the second side, while the non-through plug extends from the first side to an internal plane without extending through the second side.

In some embodiments, the step of forming a first hole and a second hole in the semiconductor substrate comprises: forming a mask layer on the first side, and the mask layer has a first opening and a second opening smaller than the first opening; and performing an etching process to remove a portion of the semiconductor substrate under the first opening and the second opening.

In some embodiments, the step of forming a conductive through plug in the first hole and a non-through plug in the second hole comprises: filling the first hole and the second hole with a conductor; and thinning the semiconductor substrate from the second side to expose the conductor in the first hole without exposing the conductor in the second hole; wherein the non-through plug comprises a visually recognizable two-dimensional pattern in a plane view from the second side.

In some embodiments, the step of forming a first hole and a second hole in the semiconductor substrate comprises: forming a first mask layer having a first opening on the first side; performing a first etching process to remove a portion of the semiconductor substrate under the first opening; forming a second mask layer having a second opening on the first side; and performing a second etching process to remove a portion of the semiconductor substrate under the second opening.

In some embodiments, the step of forming a conductive through plug in the first hole and a non-through plug in the second hole comprises: filling the first hole with a conductor; filling the second hole with a material different from the semiconductor substrate; and thinning the semiconductor substrate from the second side to expose the conductor in the first hole without exposing the material in the second hole; wherein the non-through plug comprises a visually recognizable two-dimensional pattern in a plane view from the second side.

In some embodiments, the method comprises steps of forming a plurality of second holes in the semiconductor substrate; and forming a plurality of non-through plugs in the plurality of second holes, wherein the plurality of non-through plugs forms a visually recognizable two-dimensional pattern in a plane view from the second side.

Another aspect of the present disclosure provides a method for manufacturing a chip package. In some embodiments, the method includes the steps of preparing a first semiconductor substrate having a first side and a second side; forming a first hole and a second hole in the first semiconductor substrate, wherein the first hole has a first depth and the second hole has a second depth smaller than the first depth; forming a conductive through plug in the first hole and a non-through plug in the second hole, wherein the conductive through plug extends through the semiconductor substrate from the first side to the second side, while the non-through plug extends from the first side to an internal plane without extending through the second side; and aligning the non-through plug with an alignment pattern on a second semiconductor substrate.

In the prior art, the conductive members and/or the conductive through plug are used to implement the alignment mark, and the conductive particles in the ACF or ACA may form an unexpected leakage path such as electrical short circuit between the conductive member below the conductive through plug of the upper semiconductor chip and the conductive member above the adjacent conductive through plug of the lower semiconductor chip, when the space between the adjacent conductive members shrinks. Similarly, in a chip package using ACF or ACA as an adhesive to bind the chips, an unexpected leakage path such as electrical short circuit is formed between the conductive member below the conductive through plug of the upper semiconductor chip and the conductive member above the adjacent conductive through plug of the lower semiconductor chip, when the space between the adjacent conductive members shrinks or there is a lateral offset due to a misalignment between the lower semiconductor chip and the upper semiconductor chip.

In contrast, in some embodiments of the present disclosure, because the non-through plug does not extend through the second side and may be formed of a non-conductive material different from the material forming the conductive through plug, the lower semiconductor chip and the upper semiconductor chip use the non-through plug to implement the alignment mark, and there will be no leakage path such as electrical short circuit even if the space between the adjacent conductive members shrinks or there is a lateral offset due to a misalignment between the lower semiconductor chip and the upper semiconductor chip.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment" etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a chip package including at least one integrated circuit die having a tilted through silicon via. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
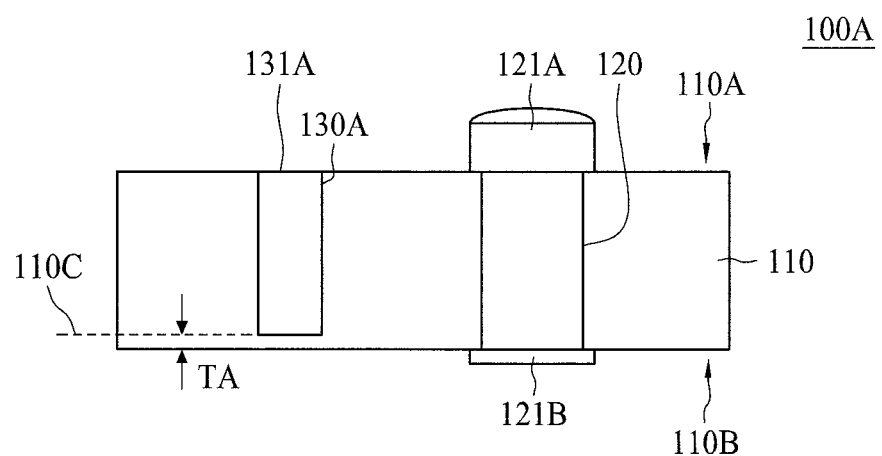
FIG. 1 is a cross-sectional view of a semiconductor chip in accordance with some embodiments of the present disclosure.

FIG. 1 is a cross-sectional view of a semiconductor chip 100A in accordance with some embodiments of the present disclosure. In some embodiments, the semiconductor chip 100A comprises a semiconductor substrate 110 having a first side 110A and a second side 110B, a conductive through plug 120 extending through the semiconductor substrate 110 from the first side 110A to the second side 110B, and a non-through plug 130A extending from the first side 110A to an internal plane 110C of the semiconductor substrate 110 without extending through the second side 110B. The non-through plug 130A includes an exposed surface 131A that is coplanar to the first side 110A of the semiconductor substrate 110. In some embodiments, the first side 110A includes, but not limited to, the upper surface of the semiconductor substrate 110 and the space above the upper surface; similarly, the second side 110B includes, but not limited to, the lower surface of the semiconductor substrate 110 and the space below the lower surface.

In some embodiments, the conductive through plug 120 has a first width, and the non-through plug 130A has a second width smaller than the first width. In some embodiments, the non-through plug 130A and the conductive through plug 120 are configured to be visually distinctive in a plane view from the second side. In some embodiments, the semiconductor chip 100A comprises a first conductive member 121A, such as a bump on the first side 110A, and a second conductive member 121B, such as a bump on the second side 110B, wherein the conductive through plug 120 electrically couples the first conductive member 121A with the second conductive member 121B while the non-through plug 130A does not electrically couple the first conductive member 110A with the second conductive member 110B.

In some embodiments, the non-through plug 130A is composed of the same conductive material as that composing the conductive through plug 120, such as tungsten (W) and copper (Cu). In some embodiments, the non-through plug 130A is composed of a material different from the material composing the semiconductor substrate 100 such that the non-through plug 130A is visually recognizable in a plane view from the second side 110B. In some embodiments, the thickness (TA) of the semiconductor substrate 110 right below the internal plane 110C is thin enough such that the non-through plug 130A is visually recognizable in a plane view from the second side 110B.

In some embodiments, the semiconductor substrate 110 may include a silicon wafer. For example, the semiconductor substrate 110 may include a single crystalline silicon wafer, a silicon bulk wafer including a silicon carbide (SiC) layer or silicon germanium (SiGe) layer, or a silicon-on-insulator (SOI) wafer including an insulating layer. In the present embodiments, it is assumed that the semiconductor substrate 110 is a single crystalline silicon bulk wafer. In some embodiments, the semiconductor chip 100A may include unit devices, which may be formed in the semiconductor substrate 110 and/or on the semiconductor substrate 110, and the unit device(s) may include metal-oxide-semiconductor (MOS) transistors.

In some embodiments, the semiconductor chip 100A is one of a plurality of integrated circuit dies on a wafer. In some embodiments, the semiconductor chip 100A is an integrated circuit die separated from a wafer. In some embodiments, the semiconductor chip 100A is a memory chip, such as a DRAM chip or flash memory chip. It is well known that a memory chip comprises address input terminals for addressing memory cells, data input/output terminals for inputting/outputting data to/from the memory cells, and power supply terminals.

Figure 2:
FIG. 2 shows top views of several alignment marks in accordance with some embodiments of the present disclosure.

FIG. 2 shows top views of several alignment marks in accordance with some embodiments of the present disclosure. In some embodiments, the non-through plug 130A comprises an alignment mark, which is a two-dimensional pattern visually recognizable in a plane view from the second side 110B. In some embodiments, the alignment mark of the non-through plug 130A can be crisscross-shaped, L-shaped, ring-shaped, triangle-shaped, or a circle with a missing sector.

Figure 3:
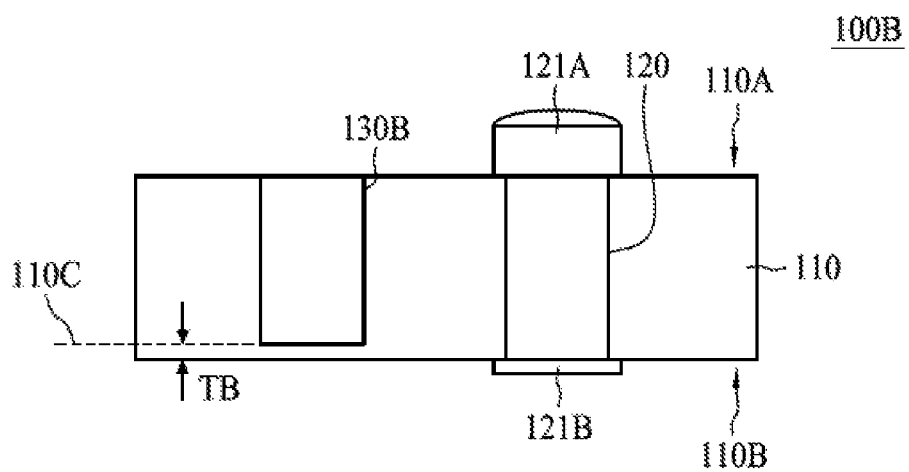
FIG. 3 is a cross-sectional view of a semiconductor chip in accordance with some embodiments of the present disclosure.

FIG. 3 is a cross-sectional view of a semiconductor chip 100B in accordance with some embodiments of the present disclosure. The semiconductor chip 100B shown in FIG. 3 is substantially the same as the semiconductor chip 100A shown in FIG. 1, except for the width of the non-through plug 130B. In FIG. 1, the width of the non-through plug 130A is smaller than that of the conductive through plug 120; in contrast, in FIG. 3, the width of the non-through plug 130B is substantially the same as that of the conductive through plug 120. In some embodiments, the alignment mark of the non-through plug 130B can use the crisscross-shape, L-shape, ring-shape, triangle-shape, or circle with a missing sector, as shown in FIG. 2.

Figure 4:
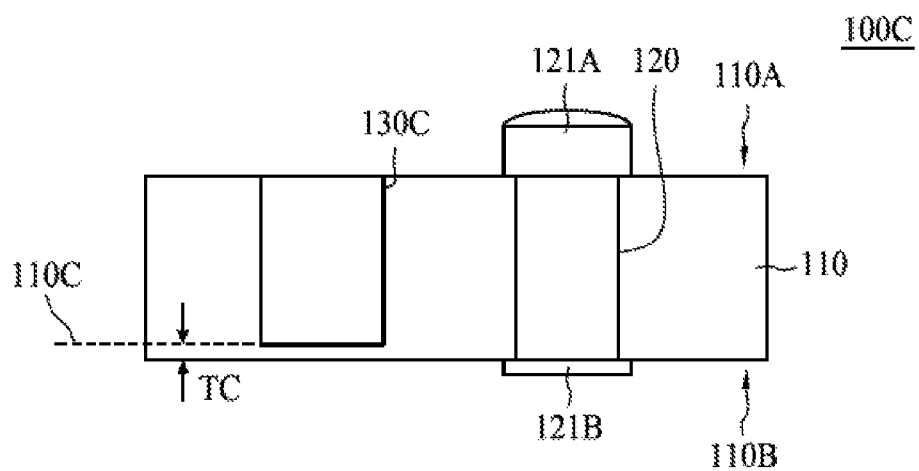
FIG. 4 is a cross-sectional view of a semiconductor chip in accordance with some embodiments of the present disclosure.

FIG. 4 is a cross-sectional view of a semiconductor chip 100C in accordance with some embodiments of the present disclosure. The semiconductor chip 100C shown in FIG. 4 is substantially the same as the semiconductor chip 100A shown in FIG. 1, except for the width of the non-through plug 130C. In FIG. 1, the width of the non-through plug 130A is smaller than that of the conductive through plug 120; in contrast, in FIG. 4, the width of the non-through plug 130D is larger than that of the conductive through plug 120. In some embodiments, the alignment mark of the non-through plug 130B can use the crisscross-shape, L-shape, ring-shape, triangle-shape, or circle with a missing sector as shown in FIG. 2.

Figure 5:
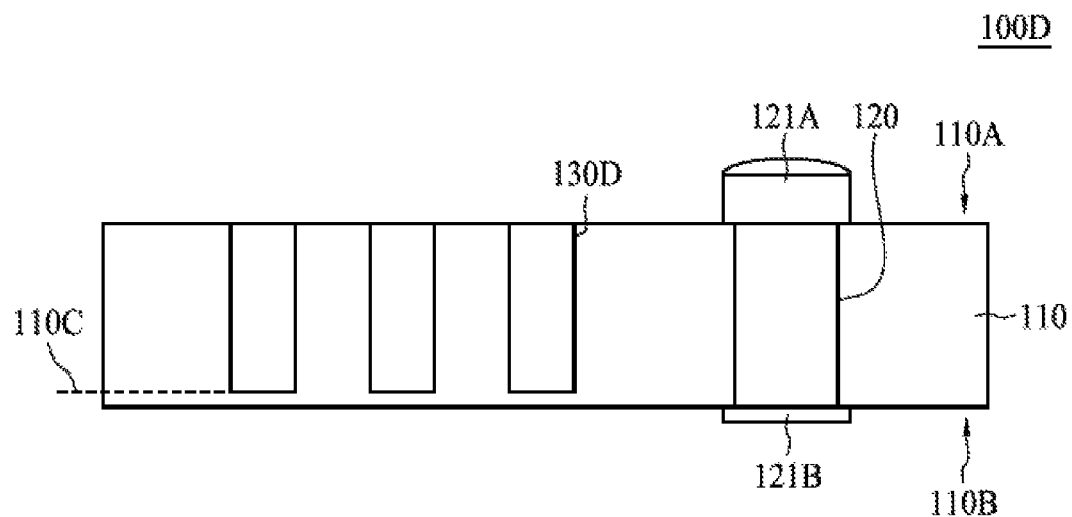
FIG. 5 is a cross-sectional view of a semiconductor chip in accordance with some embodiments of the present disclosure.

FIG. 5 is a cross-sectional view of a semiconductor chip 100D in accordance with some embodiments of the present disclosure. The semiconductor chip 100D shown in FIG. 5 is substantially the same as the semiconductor chip 100A shown in FIG. 1, except for the design of the alignment mark implemented by the non-through plugs 130D at the second side 110B. In FIG. 1, the alignment mark of the semiconductor chip 100A is implemented by the visually recognizable two-dimensional pattern of the non-through plugs 130D at the second side 110B. In contrast, the semiconductor chip 100D comprises a plurality of non-through plugs 130D extending from the first side 110A to an internal plane 110C of the semiconductor substrate 110 without extending the second side 110B, and the alignment mark of the semiconductor chip 100D is implemented by the visually recognizable two-dimensional pattern of the non-through plugs 130D at the second side 110B.

Figure 6:
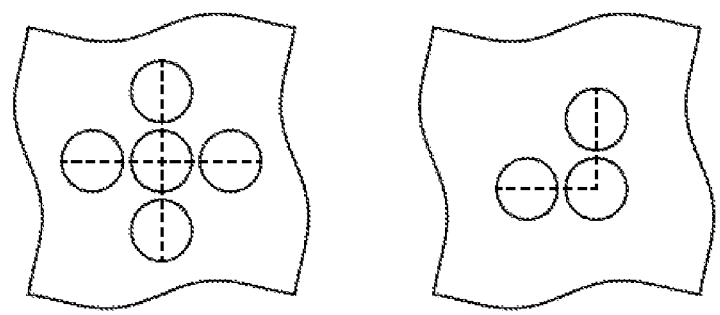
FIG. 6 shows top views of several alignment marks in accordance with some embodiments of the present disclosure.

FIG. 6 shows top views of several alignment marks in accordance with some embodiments of the present disclosure. In some embodiments, the non-through plugs 130D form an alignment mark, which is a two-dimensional pattern visually recognizable in a plane view from the second side 110B. In some embodiments, the alignment mark implemented by the non-through plugs 130D can be crisscross-shaped or L-shaped. In some embodiments, the plurality of non-through plugs have the same width. In some embodiments each of the non-through plugs 130D may not be a two-dimensional pattern visually recognizable in a plane view from the second side 110B, but the plurality of the non-through plugs 130D together form a two-dimensional pattern, such as a crisscross-shape or L-shape, which is visually recognizable in a plane view from the second side 110B.

FIGS. 7-11 are cross-sectional views showing the fabrication of a semiconductor chip 100A in accordance with some embodiments of the present disclosure.

Figure 7:
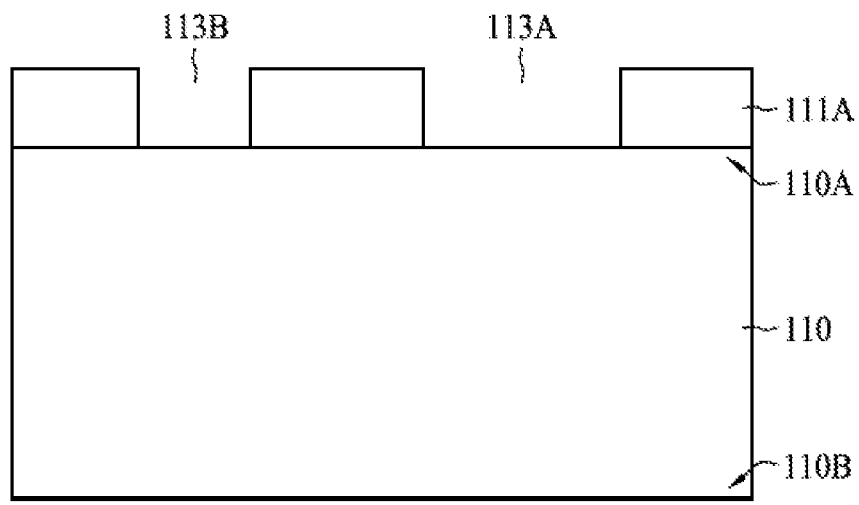
FIGS. 7-11 are cross-sectional views showing the fabrication of a semiconductor chip in accordance with some embodiments of the present disclosure.

Referring to FIG. 7, a mask layer 111A is formed on a first side 110A of a semiconductor substrate 110, wherein the mask layer 111A has a first opening 113A and a second opening 113B smaller than the first opening 113A. In some embodiments, the mask layer 111A is a photoresist layer formed by a lithographic process, or a hard mask layer formed by deposition, lithographic, and etching processes.

Figure 8:
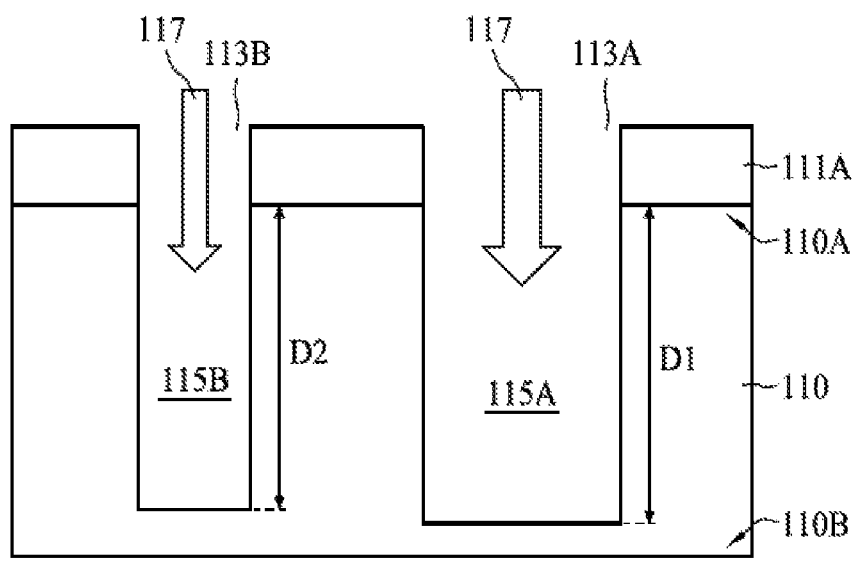

Referring to FIG. 8, an etching process, such as an anisotropic day etching by using an etching gas 117, is then performed to remove a portion of the semiconductor substrate 110 under the first opening 113A and the second opening 113B so as to form a first hole 115A and a second hole 115B in the semiconductor substrate 110. Because the width of the second opening 113B is smaller than that of the first opening 113A, the etching rate of the semiconductor substrate 110 under the second opening 113B is smaller than that under the first opening 113A. Consequently, the first hole 115A has a first depth D1 and the second hole 115B has a second depth D2 smaller than the first depth D1.

Figure 9:
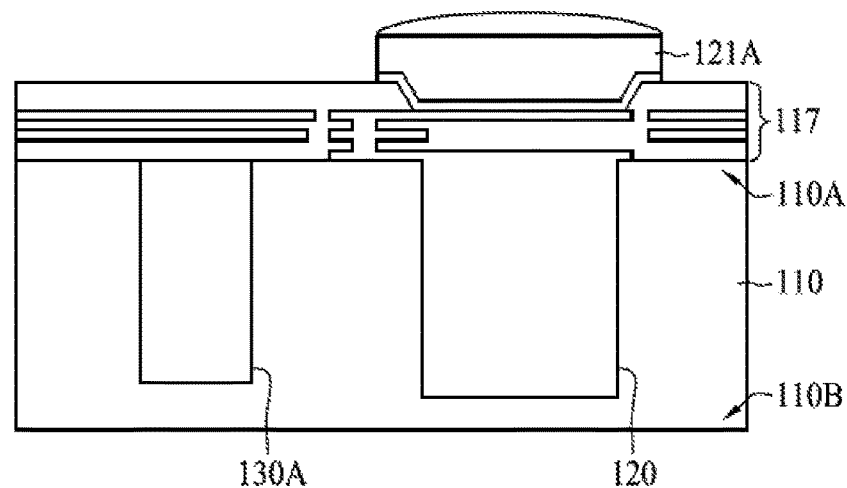

Referring to FIG. 9, the mask layer 111A is removed from the semiconductor substrate 110, and a conductive through plug 120 is formed in the first hole 115A and a non-through plug 130A is formed in the second hole 115B by filling the first hole 115A and the second hole 115B with a conductor. Subsequently, an electrical interconnect structure 117 is formed on the first side 110A, and a first conductive member 121A, such as a bump, is formed on the electrical interconnect structure 117.

Figure 10:
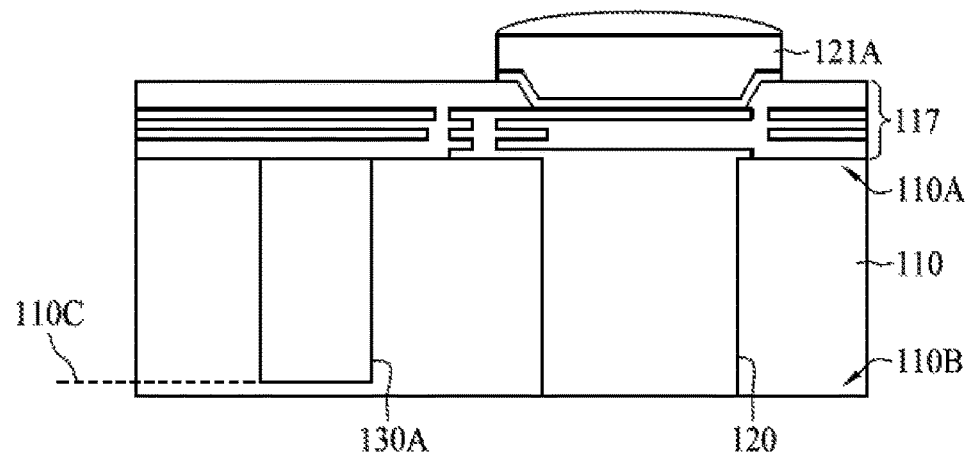

Referring to FIG. 10, the semiconductor substrate 110 is thinned by performing a grinding process from the second side 110B to expose the conductor of the conductive through plug 120 without exposing the conductor of the non-through plug 130A. Consequently, the conductive through plug 120 extends through the semiconductor substrate 110 from the first side 110A to the second side 110B, while the non-through plug 130A extends from the first side 110A to an internal plane 110C without extending through the second side 110B.

Figure 11:
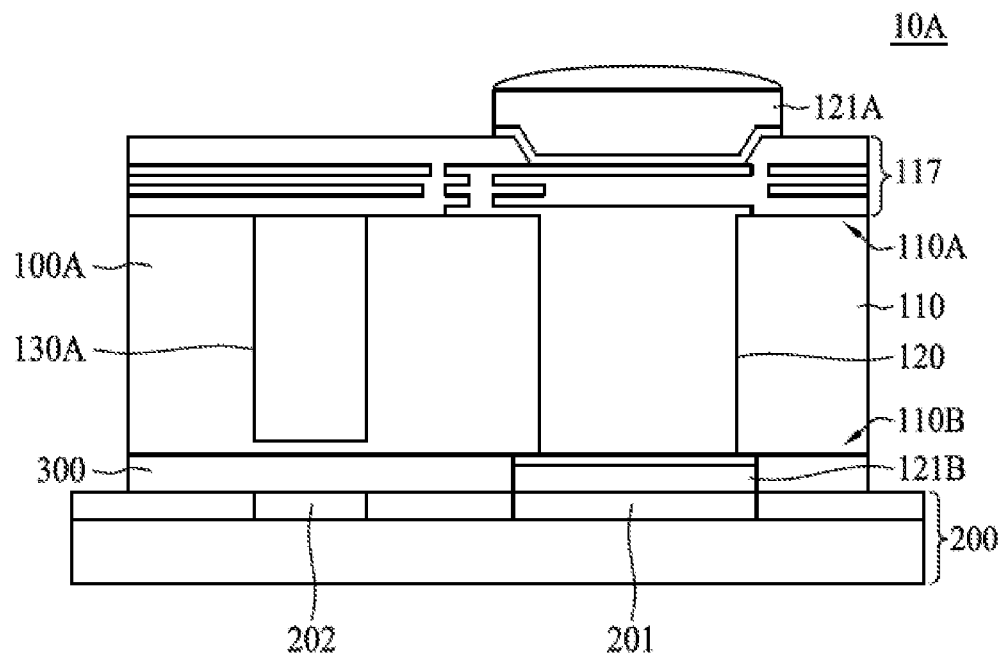

Referring to FIG. 11, a second conductive member 121B, such as a bump, is formed on the second side 110B, wherein the conductive through plug 120 electrically couples the first conductive member 121A with the second conductive member 121B, while the non-through plug 130A does not electrically couple the first conductive member 110A with the second conductive member 110B. Subsequently, the semiconductor chip 100A is attached to an object 200 with an adhesive layer 300 interposed between the semiconductor chip 100A and the object 200 to form a chip package 10A.

In some embodiments, the object 200 is a package circuit substrate, silicon/glass interposer or another semiconductor chip, the conductive through plug 120 is electrically coupled to a conductive member 201 of the object 200, and the non-through plug 130A is aligned with an alignment pattern 202 on the object 200.

In some embodiments, the adhesive layer 300 is an anisotropic conductive film (ACF), an anisotropic conductive adhesive (ACA), nonconductive film/paste (NCF/NCP) underfill MUF (molding underfill), and so on. The ACF or the ACA comprises an insulation film or an insulating adhesive, and conductive particles dispersed within the insulation film or the insulating adhesive. The NCF/NCP or underfill/MUF comprises an insulation film or adhesive, and non-conductive particles dispersed within insulation film/adhesive.

Figure 12:
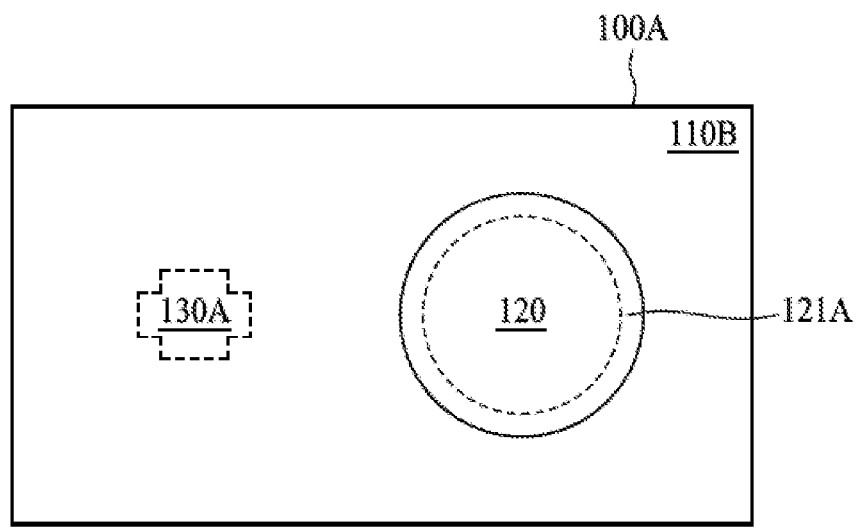
FIG. 12 is a top view of the semiconductor chip in accordance with some embodiments of the present disclosure.

FIG. 12 is a top view of the semiconductor chip 100A in accordance with some embodiments of the present disclosure. In some embodiments, the non-through plug 130A has a visually recognizable two-dimensional pattern in a plane view from the second side 110B, and the visually recognizable two-dimensional pattern functions as an alignment mark when stacking the semiconductor chip 100A to the object 200, wherein the shape of the visually recognizable two-dimensional pattern includes but not limited to those shown in FIG. 2.

In some embodiments, the semiconductor chip 100D can be fabricated substantially by the processes disclosed in FIGS. 7-11, wherein the layout of the mask layer 111A shown in FIGS. 7-8 shall be changed to have a plurality of second openings corresponding to the non-through plugs 130D.

FIGS. 13-19 are cross-sectional views showing the fabrication of a semiconductor chip 100B in accordance with some embodiments of the present disclosure.

Figure 13:
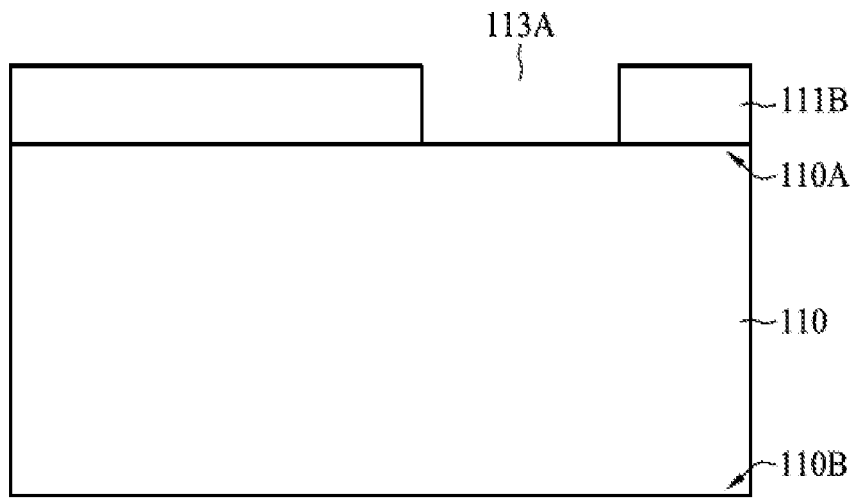
FIGS. 13-19 are cross-sectional views showing the fabrication of a semiconductor chip in accordance with some embodiments of the present disclosure.

Referring to FIG. 13, a mask layer 111B is formed on a first side 110A of a semiconductor substrate 110, wherein the mask layer 111A has an opening 113A. In some embodiments, the mask layer 111B is a photoresist layer formed by a lithographic process, or a hard mask layer formed by deposition, lithographic, and etching processes.

Figure 14:
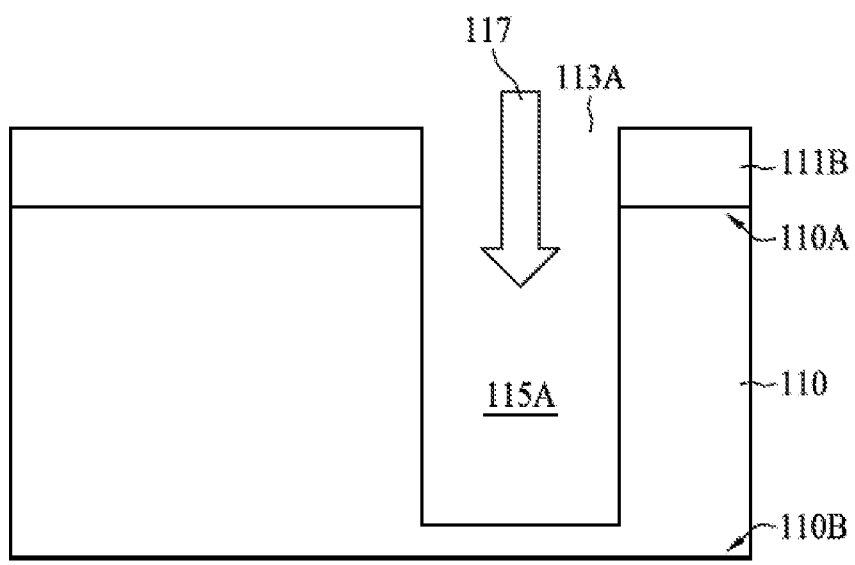

Referring to FIG. 14, an etching process, such as an anisotropic dry etching by using an etching gas 117 is then performed to remove a portion of the semiconductor substrate 110 under the opening 113A so as to form a hole 115A in the semiconductor substrate 110.

Figure 15:
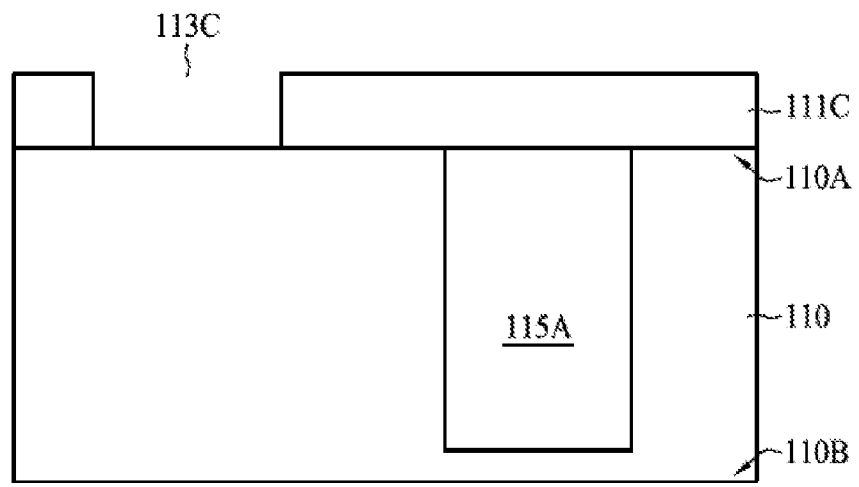

Referring to FIG. 15, the mask layer 111B is removed from the semiconductor substrate 110, and a mask layer 111C is formed on a first side 110A of the semiconductor substrate 110, wherein the mask layer 111C has an opening 113C. In some embodiments, the mask layer 111C is a photoresist layer formed by a lithographic process, or a hard mask layer formed by deposition, lithographic, and etching processes.

Figure 16:
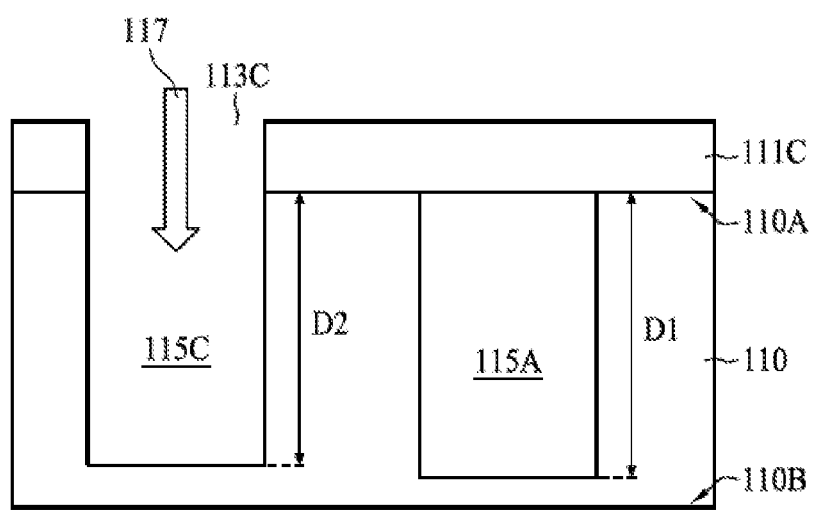

Referring to FIG. 16, an etching process, such as an anisotropic dry etching by using an etching gas 117 is then performed to remove a portion of the semiconductor substrate 110 under the opening 113C so as to form a hole 115C in the semiconductor substrate 110. The hole 115A has a first depth D1 and the hole 115C has a second depth D2 smaller than the first depth D1. In some embodiments, the hole 115A and the hole 115C may have the same width; in some embodiments, the width of the hole 115A may be smaller than that of the hole 115C.

Figure 17:
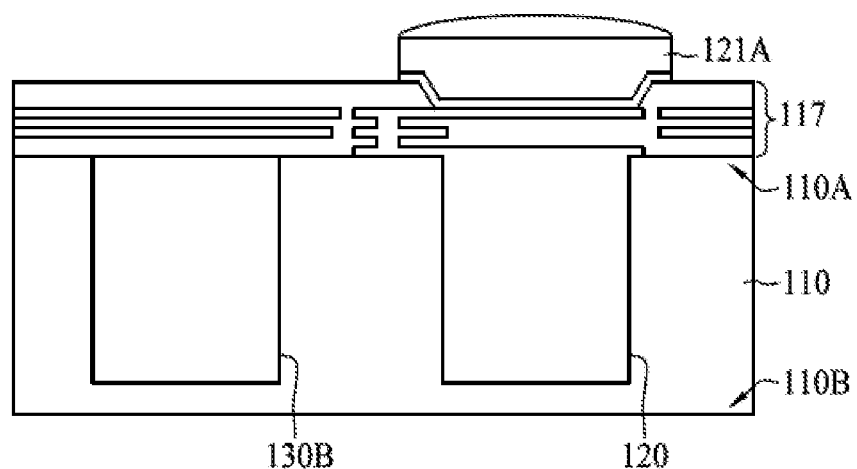

Referring to FIG. 17, a conductive through plug 120 is formed in the hole 115A by filling the hole 115A with a conductor, and a non-through plug 130B is formed in the hole 115C by filling the hole 115C with a material. Subsequently, an electrical interconnect structure 117 is formed on the first side 110A, and a first conductive member 121A, such as a bump, is formed on the electrical interconnect structure 117.

Figure 18:
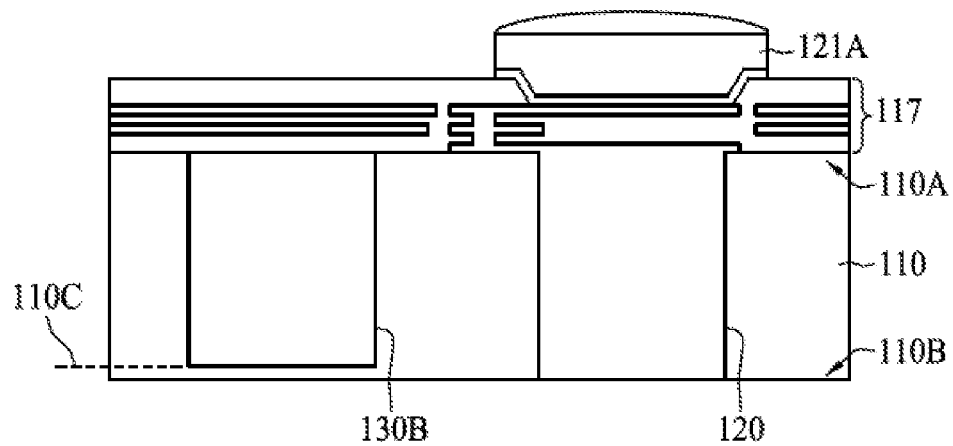

Referring to FIG. 18, the semiconductor substrate 110 is thinned by performing a grinding process from the second side 110B to expose the conductor of the conductive through plug 120 without exposing the material of the non-through plug 130B. Consequently, the conductive through plug 120 extends through the semiconductor substrate 110 from the first side 110A to the second side 110B, while the non-through plug 130B extends from the first side 110A to an internal plane 110C without extending through the second side 110B.

Figure 19:
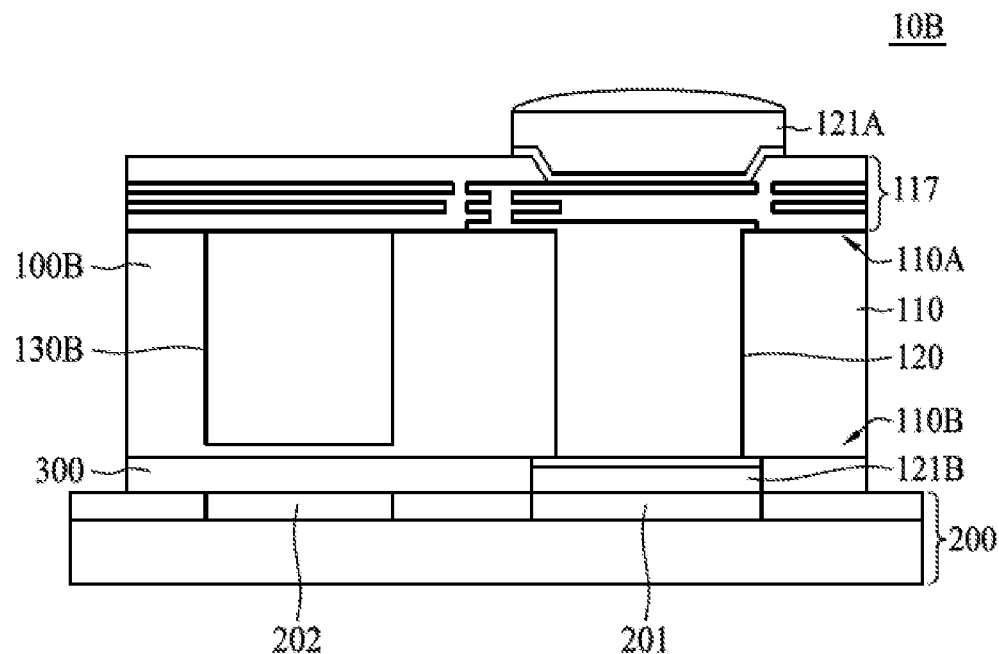

Referring to FIG. 19, a second conductive member 121B, such as a bump, is formed on the second side 110B, wherein the conductive through plug 120 electrically couples the first conductive member 121A with the second conductive member 121B, while the non-through plug 130B does not electrically couple the first conductive member 121A with the second conductive member 121B. Subsequently, the semiconductor chip 100B is attached to an object 200 with an adhesive layer 300 interposed between the semiconductor chip 100B and the object 200 to form a chip package 10B.

In some embodiments, the object 200 is a package circuit substrate, silicon/glass interposer or another semiconductor chip, the conductive through plug 120 is electrically coupled to a conductive member 201 of the object 200, and the non-through plug 130B is aligned with an alignment pattern 202 on the object 200.

Figure 20:
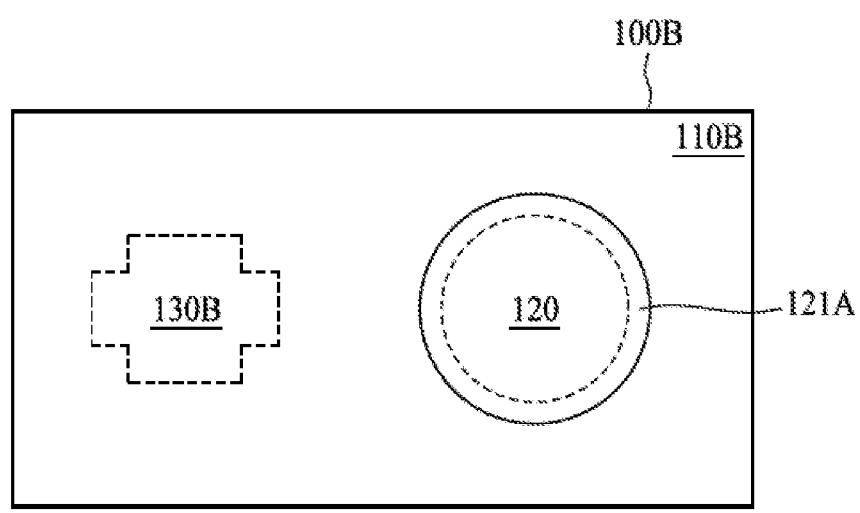
FIG. 20 is a top view of the semiconductor drip in accordance with some embodiments of the present disclosure.

FIG. 20 is a top view of the semiconductor chip 100B in accordance with some embodiments of the present disclosure. In some embodiments, the non-through plug 130B comprises a visually recognizable two-dimensional pattern in a plane view from the second side 110B, and the visually recognizable two-dimensional pattern functions as an alignment mark when stacking the semiconductor chip 100B to the object 200, wherein the shape of the visually recognizable two-dimensional pattern includes, but not limited to those shown in FIG. 2.

In some embodiments, the semiconductor chip 100D can be fabricated substantially by the processes disclosed in FIGS. 13-19, wherein the layout of the mask layer 111C shown in FIGS. 15-16 shall be changed to have a plurality of second openings corresponding to the non-through plugs 130D.

Figure 21:
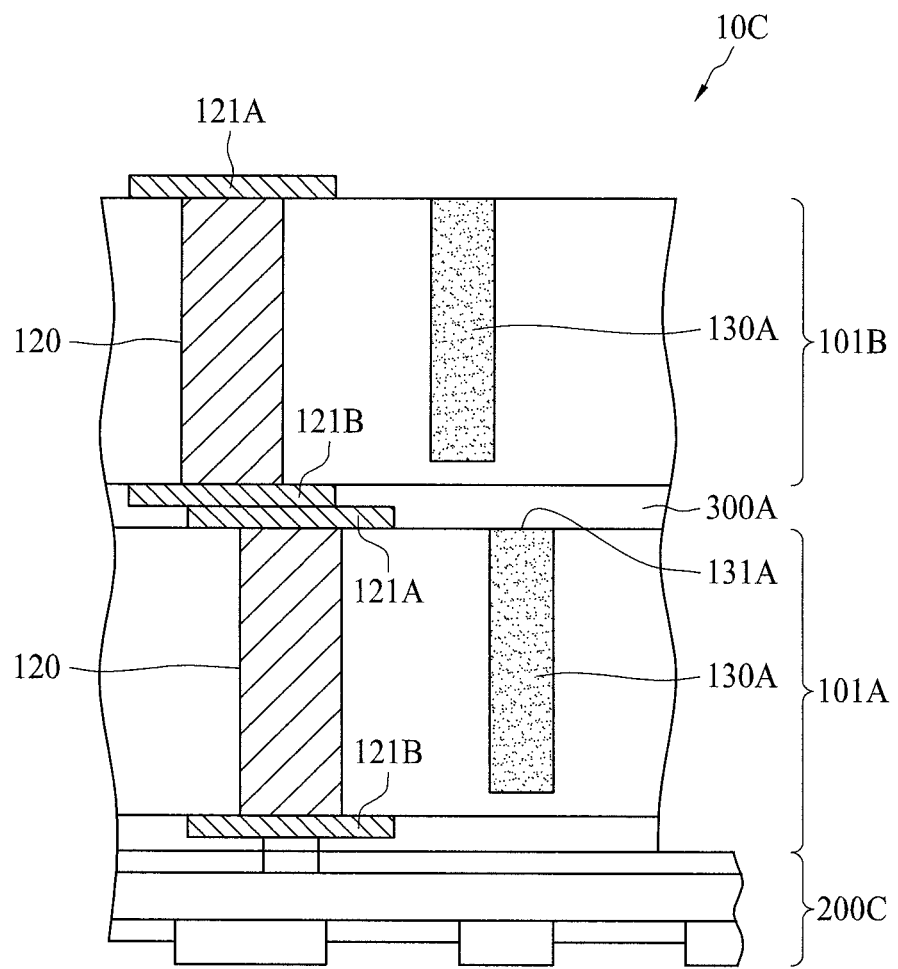
FIG. 21 illustrates a chip package in accordance with some embodiments of the present disclosure.
Figure 22:
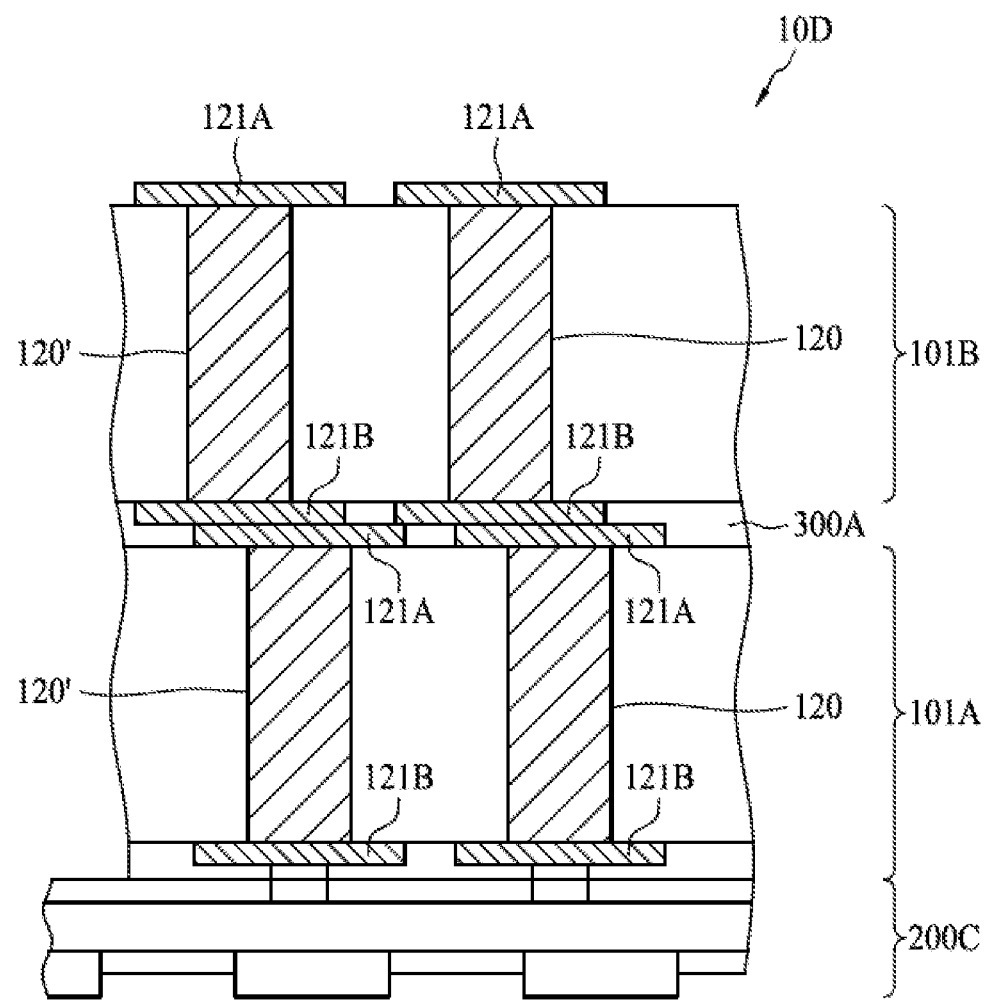
FIG. 22 illustrates a chip package according to the prior art.

FIG. 21 illustrates a chip package 10C in accordance with some embodiments of the present disclosure, and FIG. 22 illustrates a chip package 10D according to the prior art. In some embodiments, the chip package 10C comprises a lower semiconductor chip 101A stacked on an object 200C and an upper semiconductor chip 101B stacked on the lower semiconductor chip 101A via an adhesive layer 300A, wherein the adhesive layer 300A is an NCF/NCP or underfill/MUF comprising an insulation film or adhesive, and non-conductive particles dispersed within insulation film/adhesive.

The space between the through silicon plugs becomes smaller and smaller as the size of the semiconductor chip shrinks. In the chip package 10C shown in FIG. 21, the lower semiconductor chip 101A and the upper semiconductor chip 101B use the non-through plug 130A to implement the alignment mark, and there will be no electrical short circuit even if there is a lateral offset due to a misalignment between the lower semiconductor chip 101A and the upper semiconductor chip 101B because the non-through plug 130A does not extend through the second side 110B and may be formed of a non-conductive material different from the material forming the conductive through plug 120. The exposed surface 131A of the non-through plug 130A is coplanar to the first side 110A of the semiconductor substrate 110.

In contrast, in the chip package 10D shown in FIG. 22, the conductive members 121A, 121B (and/or the conductive through plug 120') are used to implement the alignment mark. When there is a misalignment between the lower semiconductor chip 101A and the upper semiconductor chip 101B, an unexpected electrical short circuit is formed by the conductive member 121B below the conductive through plug 120 of the upper semiconductor chip 101B and the conductive member 121A above the conductive through plug 120 of the lower semiconductor chip 101A.

Figure 23:
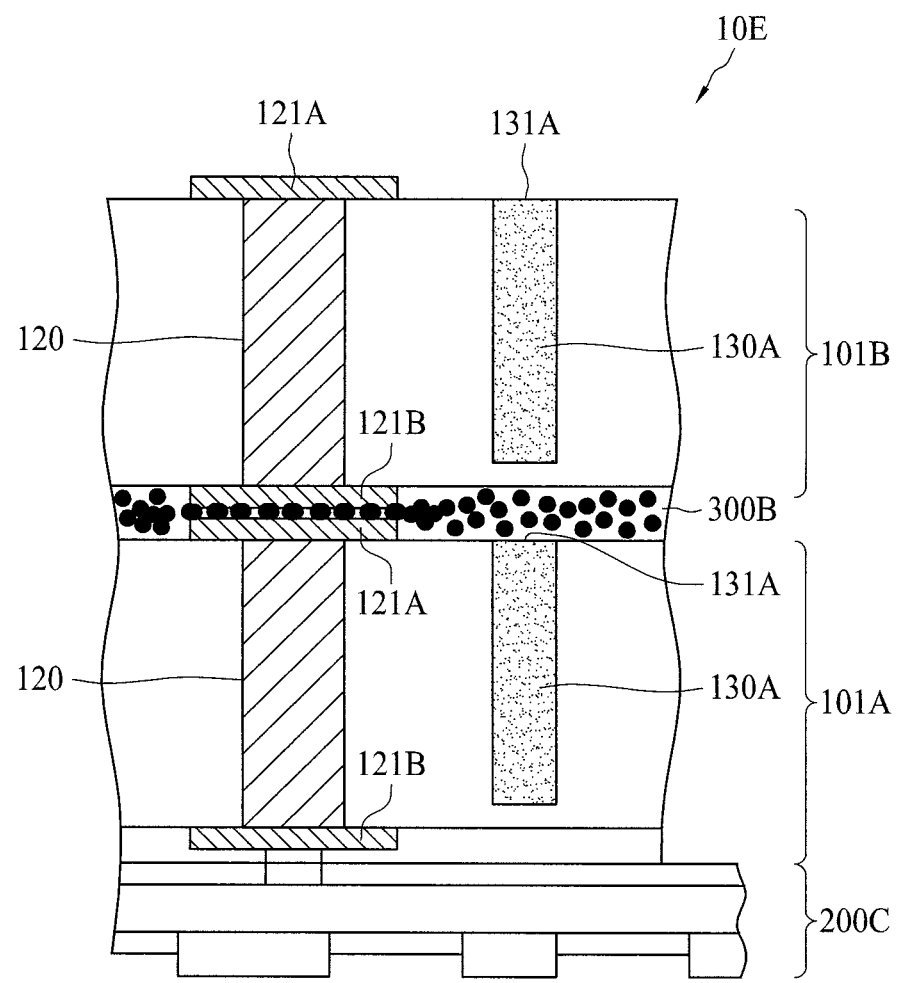
FIG. 23 illustrates a chip package in accordance with some embodiments of the present disclosure.
Figure 24:
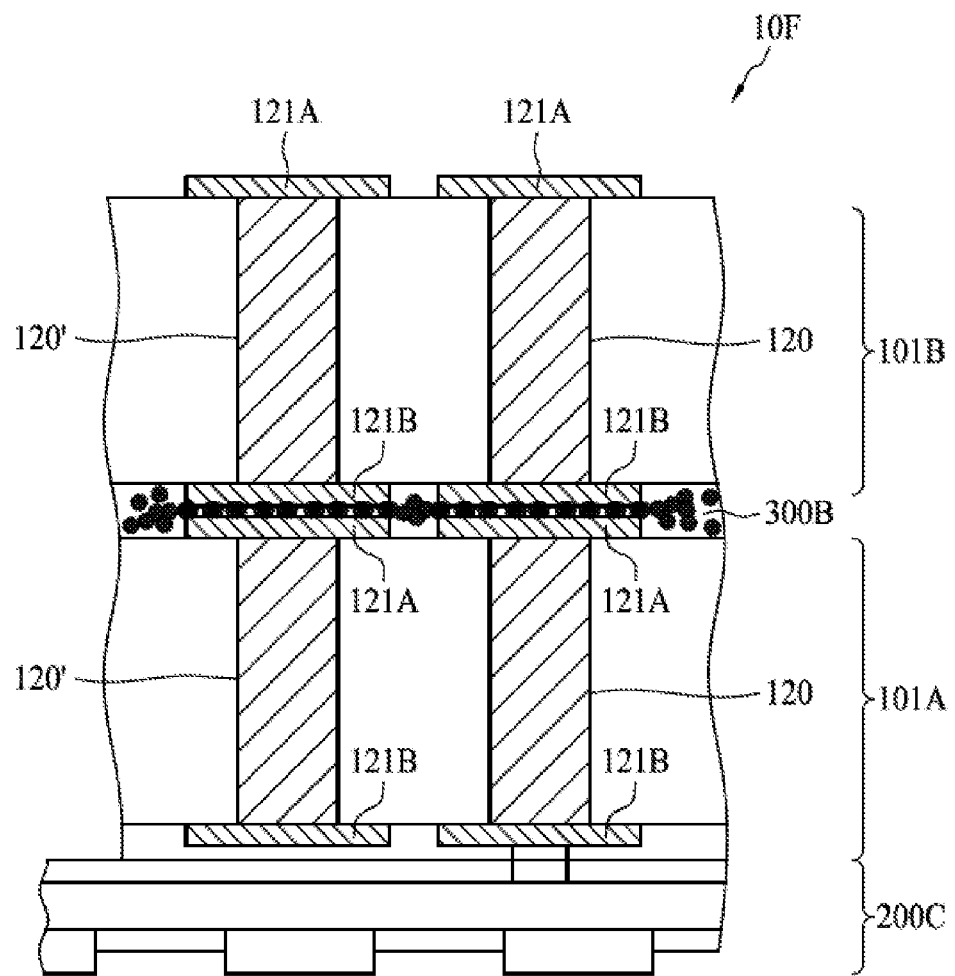
FIG. 24 illustrates a chip package according to the prior art.

FIG. 23 illustrates a chip package 10E in accordance with some embodiments of the present disclosure, and FIG. 24 illustrates a chip package 10F according to the prior art. The chip packages 10E and 10F in FIG. 23 and FIG. 24 are similar to the chip packages 10C and 10D shown in FIG. 21 and FIG. 22, except that the adhesive layer 300B is an ACF or ACA comprising an insulation film or an insulating adhesive and conductive particles dispersed within the insulation film or the insulating adhesive.

In the chip package 10E shown in FIG. 23, the lower semiconductor chip 101A and the upper semiconductor chip 101B use the non-through plug 130A to implement the alignment mark, and there will be no electrical short circuit even if the ACF or ACA is used to bind the lower semiconductor chip 101A and the upper semiconductor chip 101B because the non-through plug 130A does not extend through the second side 110B and may be formed of a non-conductive material different from the conductive material forming the conductive through plug 120. The exposed surface 131A of the non-through plug 130A is coplanar to the first side 110A of the semiconductor substrate 110.

In contrast, in the chip package 10F shown in FIG. 24, the conductive members 121A, 121B (and/or the conductive through plug 120') are used to implement the alignment mark, and the conductive particles in the ACF or ACA may form an unexpected electrical short circuit between the conductive member 121B below the conductive through plug 120 of the upper semiconductor chip 101B and the conductive member 121A above the conductive through plug 120' the lower semiconductor chip 101A, when the space between the adjacent conductive members 121A, 121B shrinks.

One aspect of the present disclosure provides a semiconductor chip having a buried alignment mark. In some embodiments, the semiconductor chip includes a semiconductor substrate having a first side and a second side, a conductive through plug extending through the semiconductor substrate from the first side to the second side, and a non-through plug extending from the first side to an internal plane of the semiconductor substrate without extending through the second side.

Another aspect of the present disclosure provides a chip package including a first semiconductor chip and a second semiconductor chip. In some embodiments, the first semiconductor chip includes a semiconductor substrate having a first side and a second side, a conductive through plug extending through the semiconductor substrate from the first side to the second side, and a non-through plug extending from the first side to an internal plane of the semiconductor substrate without extending through the second side. In some embodiments, the second semiconductor chip is adjacent to the first semiconductor chip, the conductive through plug is coupled to a conductive member of the second semiconductor chip, and the non-through plug is aligned with an alignment pattern on the second semiconductor chip.

Another aspect of the present disclosure provides a method for manufacturing a semiconductor chip with a buried alignment mark. In some embodiments, the method includes the steps of preparing a semiconductor substrate having a first side and a second side; forming a first hole and a second hole in the semiconductor substrate, wherein the first hole has a first depth and the second hole has a second depth smaller than the first depth; and forming a conductive through plug in the first hole and a non-through plug in the second hole, wherein the conductive through plug extends through the semiconductor substrate from the first side to the second side, while the non-through plug extends from the first side to an internal plane without extending through the second side.

Another aspect of the present disclosure provides a method for manufacturing a chip package. In some embodiments, the method includes the steps of preparing a first semiconductor substrate having a first side and a second side; forming a first hole and a second hole in the first semiconductor substrate, wherein the first hole has a first depth and the second hole has a second depth smaller than the first depth; forming a conductive through plug in the first hole and a non-through plug in the second hole, wherein the conductive through plug extends through the semiconductor substrate from the first side to the second side, while the non-through plug extends from the first side to an internal plane without extending through the second side; and aligning the non-through plug with an alignment pattern on a second semiconductor substrate.

In the prior art, the conductive members and/or the conductive through plug are used to implement the alignment mark, and the conductive particles in the ACF or ACA may form an unexpected electrical short circuit between the conductive member below the conductive through plug of the upper semiconductor chip and the conductive member above the adjacent conductive through plug of the lower semiconductor chip when the space between the adjacent conductive members shrinks. Similarly, in a chip package using ACF or ACA as an adhesive to bind the chips, an unexpected electrical short circuit is formed between the conductive member below the conductive through plug of the upper semiconductor chip and the conductive member above the adjacent conductive through plug of the lower semiconductor chip when the space between the adjacent conductive members shrinks or there is a lateral offset due to a misalignment between the lower semiconductor chip and the upper semiconductor chip.

In contrast, in some embodiments of the present disclosure, because the non-through plug does not extend through the second side and may be formed of a non-conductive material different from the conductive material forming the conductive through plug the lower semiconductor chip and the upper semiconductor chip use the non-through plug to implement the alignment mark, and there will be no electrical short circuit even if the space between the adjacent conductive members shrinks or there is a lateral offset due to a misalignment between the lower semiconductor chip and the upper semiconductor chip.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may to be utilized according to the present disclosure. Accordingly, the appended claims are intended to include within their scope such processes, machines, manufacture, compositions of matter, means, methods, or steps.

What is claimed is:

1. A chip package comprising a first semiconductor chip and a second semiconductor chip, wherein the first semiconductor chip comprises:
    a semiconductor substrate having a first side and a second side;
    a conductive through plug extending through the semiconductor substrate from the first side to the second side; and
    a non-through plug extending from the first side to an internal plane of the semiconductor substrate without extending through the second side, wherein the non-through plug includes an exposed surface that is coplanar to the first side;
    wherein the second semiconductor chip is adjacent to the first semiconductor chip, and the second semiconductor chip includes a conductive member with a thickness, and wherein the conductive through plug is coupled to the conductive member of the second semiconductor chip, while the non-through plug is not electrically coupled to the conductive member of the second semiconductor chip;
    wherein the exposed surface of the non-through plug contacts a space between the second semiconductor chip and the first side of the first semiconductor chip, and the space has a height at least more than the thickness of the conductive member of the second semiconductor chip;
    wherein the non-through plug is aligned with an alignment pattern on the second semiconductor chip.

2. The chip package of claim 1, wherein the non-through plug comprises an alignment mark.

3. The chip package of claim 2, wherein the alignment mark is a two-dimensional pattern.

4. The chip package of claim 1, comprising a plurality of non-through plugs extending from the first side to an internal plane of the semiconductor substrate without extending through the second side.

5. The chip package of claim 4, wherein the plurality of non-through plugs forms an alignment mark, and the alignment mark is visually recognizable in a plane view from the second side.

6. The chip package of claim 4, wherein the plurality of non-through plugs form a visually recognizable two-dimensional pattern in a plane view from the second side.

7. The chip package of claim 4, wherein the plurality of non-through plugs have the same width.

8. The chip package of claim 1, wherein the non-through plug and the conductive through plug are configured to be visually distinctive in a plane view from the second side.

9. The chip package of claim 1, wherein the conductive through plug has a first width, and the non-through plug has a second width smaller than the first width.

10. The chip package of claim 1, further comprising:
    a first conductive member on the first side;
    a second conductive member on the second side; and
    wherein the conductive through plug electrically couple the first conductive member with the second conductive member, while the non-through plug does not electrically couple the first conductive member with the second conductive member.

11. The chip package of claim 1, wherein the non-through plug and the conductive through plug are composed of the same conductive material.

* * * * *